United States Patent [19]

Putnam

[11] 4,381,831

[45] May 3, 1983

[54] HIGH FREQUENCY HORN

[75] Inventor: Milton T. Putnam, Tarzana, Calif.

[73] Assignee: United Recording Electronic Industries, Hollywood, Calif.

[21] Appl. No.: 201,548

[22] Filed: Oct. 28, 1980

[51] Int. Cl.[3] .......... H05K 5/00

[52] U.S. Cl. .......... 181/152; 181/DIG. 1; 181/159; 181/184; 181/192; 179/115.5 H; 179/180

[58] Field of Search .......... 179/115.5 H, 115.5 PS, 179/181 F, 152; 181/177, 180, 184, 195, 166, 185, 192, DIG. 1, 175

[56] References Cited

U.S. PATENT DOCUMENTS

| | | | |
|---|---|---|---|
| 3,356,179 | 2/1967 | Tomkins | 181/152 |
| 3,982,607 | 8/1976 | Evans | 181/152 |
| 4,171,734 | 10/1979 | Peveto et al. | 181/192 |
| 4,283,606 | 8/1981 | Buck | 179/115.5 H |

OTHER PUBLICATIONS

H. M. Tremaine, Audio Cyclopedia, 1977, para. #2-34.

*Primary Examiner*—A. D. Pellinen
*Assistant Examiner*—Robert Lev
*Attorney, Agent, or Firm*—Freilich, Hornbaker, Wasserman, Rosen & Fernandez

[57] ABSTRACT

A loudspeaker horn is described, which produces good coupling of sound to the atmosphere, while avoiding perturbations in magnitude and phase that would produce large narrow-frequency losses or transient distortions. The horn includes a major sound-reflective portion of typical horn shape, and also includes a buffer extending around the large end of the horn. The buffer has a sound absorption coefficient about halfway between the almost zero absorption coefficient of the major portion of the boundary walls of the horn and the 100% absorption coefficient of the ambient atmosphere, to couple sound to the atmosphere more efficiently, and with an efficiency that is relatively constant with frequency. A horn of largely rectangular cross-section, has corner regions covered with highly sound absorbing material, to minimize transient distortions such as "ringing".

14 Claims, 8 Drawing Figures

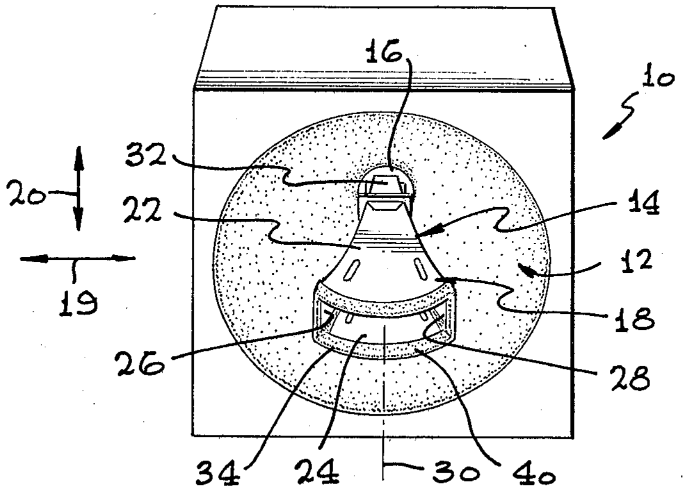
FIG. 1
FIG. 2
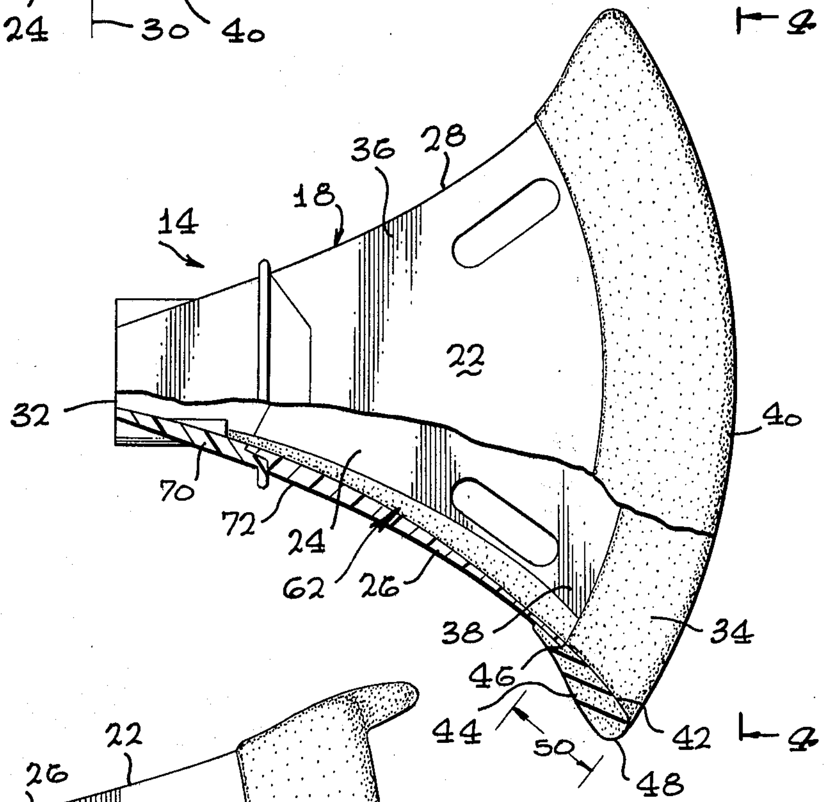
FIG. 3
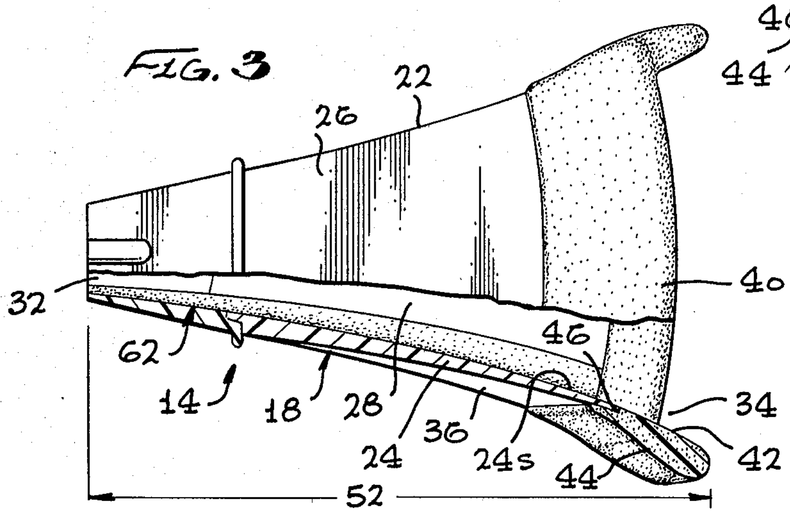

FIG. 4
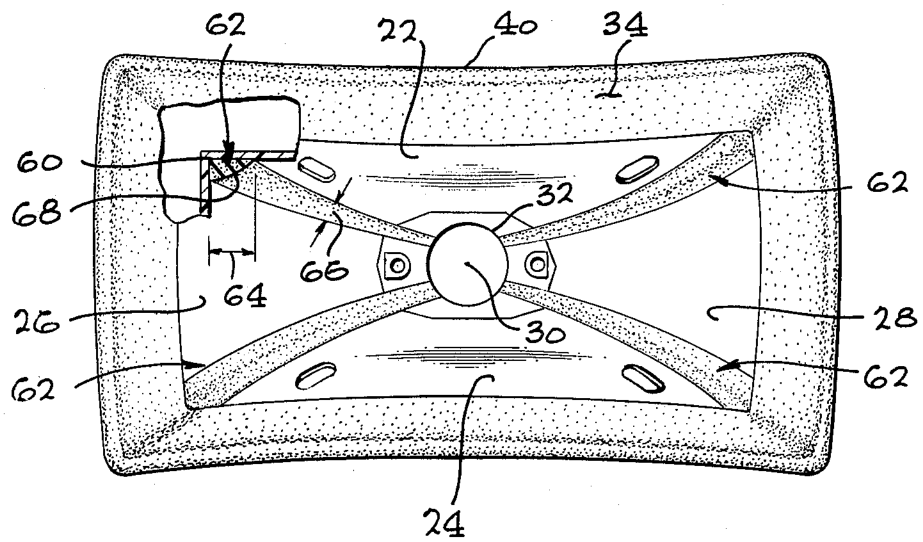
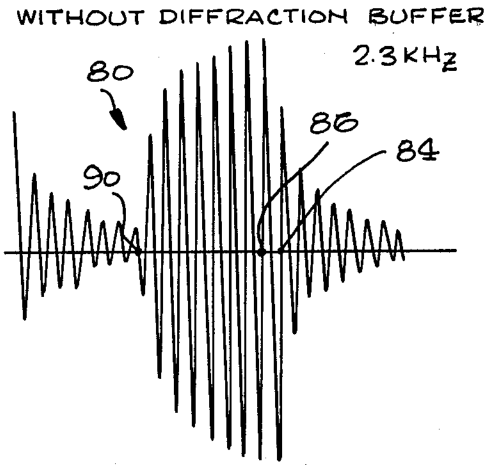
FIG. 5
PRIOR ART
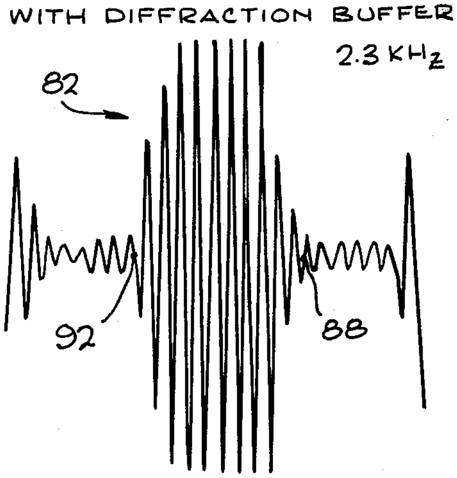
FIG. 6
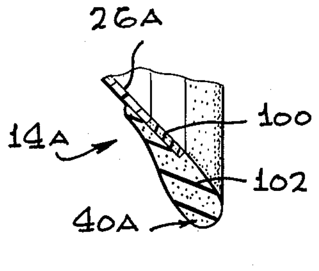
FIG. 7
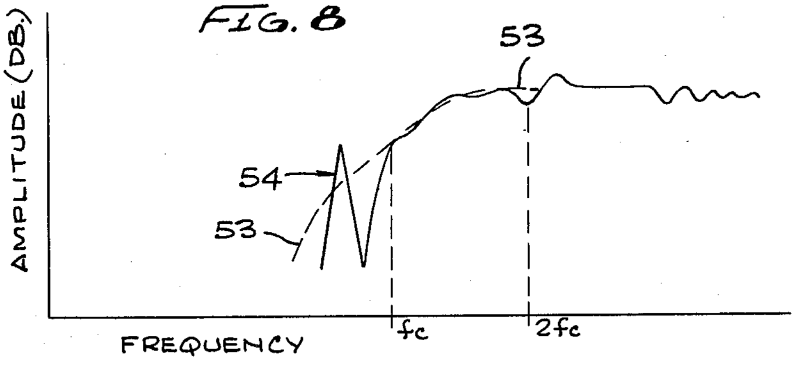
FIG. 8

HIGH FREQUENCY HORN

BACKGROUND OF THE INVENTION

A high fidelity loudspeaker system may include two or more different loudspeaker portions for propagating sounds of different frequency ranges. The highest frequency loudspeaker may be utilized, for example, to propagate sound between about 1.5 kHz and 20 kHz. Because of the directionality of higher frequency sounds, the horn which couples sounds from the high frequency voice coil or driver to the atmosphere, is typically much wider in the horizontal direction than along its vertical or height direction, to provide good horizontal dispersion of the sound to all areas of a room.

When such a high frequency horn is tested, several phenomena can be found to occur that detract from high fidelity sound propagation. One phenomenon is that there is a loss of output over a narrow band of frequencies. Another phenomenon is that there is a "ringing" or echo effect at certain frequencies, such as near the frequency at which the output is reduced. These phenomena are present especially in high frequency horns that must be of short length to be accommodated in a housing of moderate size.

SUMMARY OF THE INVENTION

In accordance with one embodiment of the present invention, a loudspeaker horn is provided for propagation of higher audible frequencies, which minimizes perturbations that are found to occur in prior art horns. Higher frequency sounds propagated through the horn, are coupled to the atmosphere with a greater efficiency and with an efficiency which is more uniform with frequency, by the use of material in the horn which can at least partially absorb sound. A buffer extends around the large end of the horn, where sound from the horn is coupled to the atmosphere. The buffer has a surface which is partially sound absorbing, with an absorption coefficient of between 20% and 80%, to provide a more gradual transition from the almost zero absorption of most of the horn surface to the 100% absorption of the atmosphere. In a horn of largely rectangular cross-section, transient effects such as ringing are minimized by utilizing highly sound absorbent material along the inside corners of the horn where multiple sound reflections occur.

The novel features of the invention are set forth with particularity in the appended claims. The invention will be best understood from the following description when read in conjunction with the accompanying drawings.

BRIEF DESCRIPTION OF THE DRAWINGS

FIG. 1 is a perspective view of a coaxial loudspeaker system constructed in accordance with the present invention.

FIG. 2 is a plan view of the high frequency horn of the loudspeaker system of FIG. 1.

FIG. 3 is a side view of the horn of FIG. 2.

FIG. 4 is a view taken on the line 4—4 of FIG. 3.

FIG. 5 is a graph showing the transient behavior of a horn of the prior art when tested by the tone burst method FIG. 6 is a graph showing the transient behavior of a horn of the present invention when tested in the same manner.

FIG. 7 is a partial sectional view of a high frequency horn constructed in accordance with another embodiment of the invention.

FIG. 8 is a graph showing the magnitude response of a prior art high frequency horn, and of a horn of the present invention.

DESCRIPTION OF THE PREFERRED EMBODIMENTS

FIG. 1 illustrates a coaxial speaker system 10, which includes a "woofer" or low frequency loudspeaker 12 and a "tweeter" or high frequency portion 14. The high frequency portion 14, which propagates frequencies of between about 1.5 kHz to about 20 kHz, includes a driver 16 which generates sound waves over a small area, and a horn 18 which couples the generated sound waves to the atmosphere. The horn is of rectangular cross section along most of its length, and has a width in a horizontal direction 19 which is greater than its height in a vertical direction 20, to disperse higher frequency sounds over a wide area to fill a wide room. Accordingly, the top and bottom main walls 22, 24 of the horn are wider than the side walls 26, 28, at almost all cross sectional locations taken perpendicular to the axis 30 of the horn. Each of the four walls of the horn flare outwardly, to expand the cross-sectional area from the small or input end 32 of the horn to the wide end or mouth 34 of the horn.

The horn 18, which is also shown in FIGS. 2–5, includes a main housing 36 extending along most of the length of the horn, and formed of a material such as a molded plastic sheet (or metal or wood) with a smooth hard surface, to provide an inner surface 38 which is substantially totally sound reflective. A typical rigid molded plastic material absorbs only about 1% to 2% of the sound energy incident thereon. If the horn can be constructed with a great length, then the mouth area of the horn can have such a large cross sectional area that it efficiently couples the sound to the ambient atmosphere. However, since the horn must have a limited length to fit into a speaker enclosure of moderate size, and since the expansion rate of the horn (change in width with distance from the receiving end) must be limited to enable sound waves to travel therealong, the cross section of the mouth of the horn is limited and the coupling of the sound to the atmosphere is of limited efficiency and does not provide the optimum impedance match of the throat to atmosphere.

In accordance with the present invention, a buffer 40 is provided at the wide or mouth end 34 of the horn, to better couple sound waves to the ambient atmosphere. The buffer 40 includes a band of material having a sound absorption coefficient such as 50%, which is between that of the about 1% absorption coefficient of the main housing 36 and the almost 100% absorption coefficient of the atmosphere. The sound absorption coefficient of a surface is the percentage of sound incident on the surface which is absorbed rather than being reflected. For a higher frequency horn used to propagate frequencies such as 1.5 kHz (kilohertz) to 20 kHz, an important middle frequency such as 2.0 kHz may be utilized as the frequency at which the sound absorption coefficient is measured. The partially absorbent buffer 40, by providing an impedance to the movement of sound therealong which is inbetween the impedance of the main housing 36 and that of the atmosphere, provides better coupling between them. This enables a greater portion of the acoustic energy moving along the main housing 36 to be transferred to the atmosphere. The improved coupling to the atmosphere not only can increase the volume of the sound heard by a listener, for a given ouput of the high frequency driver 16, but also serves the important function of providing a more uniform output in magnitude and phase.

The acoustic resistance and the acoustic reactance of a horn to the propagation of sound therethrough changes with the frequency of the sound. Near the frequency at which the acoustic resistance and acoustic reactance are equal, severe perturbations can occur. For example, a horn of the illustrated type, but without the buffer 40, and which is utilized to propagate frequencies of about 1.5 kHz to 20 kHz, may display a sharp change in magnitude and phase of output near its lower cutoff frequency such as within a few hundred Hz below the 1.5 kHz lower cutoff frequency, and with an additional but somewhat smaller perturbation close to about twice the lower cutoff frequency (about 3 kHz). It is found that the use of the buffer 40 avoids such large changes of the magnitude and phase of the output over limited frequency bands, to thereby provide a more uniform coupling of sound to the atmosphere. The buffer also reduces, to some degree, the "ringing" effect that otherwise tends to occur at these frequencies.

The buffer 40 can be formed of a band of partially sound absorption material such as a closed-cell polyethylene foam material marketed under the name ETHA FOAM by the Dow Corning Company, and which has a sound absorption coefficient of about 50%. As discussed above, the value of the buffer 40 comes from the fact that it has a sound absorption coefficient considerably more than that of the main housing 36 and considerably less than that of the atmosphere. A coefficient of sound absorption of between about 20% and 80% will provide a significant improvement in the coupling of high frequency sound from a relatively short horn to the atmosphere. As shown in FIGS. 2 and 3, the buffer 40 is formed so that its inside surface 42 is substantially even with the inside surface of the main housing 36, such as with the inside surface **24*s* of the bottom wall 24, and also extends tangent to the wall surface 24*s*. Where the horn 18 is utilized in a coaxial speaker system, in which lower frequency sounds pass along the outer surface of the horn walls such as 24, it is also desirable to form the buffer 40 that its outer surface 44 is also largely tangent to the outer surface of the main housing 36 to prevent degrading off axis response. A smooth transition can be provided, by forming the buffer 40 in a largely tear drop shape, and with an indentation at 46, so that the buffer lies tangent to the inner and outer surfaces of the rest of the horn and provides a smoothly curved transition at 48** between them.

The effective length 50 of the buffer, as measured from the end of a reflective wall such as 26 and the end of the buffer, is chosen as a compromise. A long length of the buffer is desirable to provide good matching of horn impedance to that of the atmosphere to minimize large perturbations in magnitude and phase over limited frequency bands as well as to increase coupling efficiency. However, increasing the buffer length increases the region over which sound is absorbed, as well as decreasing the length of the rest of the horn. A length of the buffer 40 of about 15% of the length of the entire horn 18, where the horn 18 has a limited length such as six inches, provides a reasonable compromise. In one horn of an axial length 52 of about six inches, various buffer lengths were tried, and an optimum buffer length of about 1.1 inches was found desirable which is about 20% of the length 42 of the horn. A buffer length of about half to about twice this amount, such as between one-half inch and two inches, or in other words between 10% and 40% of the total horn length, can be utilized.

FIG. 8 is a diagram of magnitude vs. frequency response of a typical high frequency horn similar to the one shown in FIGS. 1-4. Line 54 represents the response of a conventional prior art high frequency horn. It can be seen that extreme perturbations in magnitude and phase occur near or below the lower cutoff (−3 db) frequency $f_c$. It is near this frequency where the output of a low frequency loudspeaker cone combines with that of the output of the high frequency horn. The extreme perturbations immediately below $f_c$, and also near 2 $f_c$, are largely avoided by the diffraction buffer 40 of the invention to produce a response such as that shown at 53.

While the buffer 40 has been developed largely to enhance the higher frequency response of a system, it is also useful to enhance the lower frequency response of a coaxial speaker system. In prior art coaxial systems, wherein the high frequency horn had a mouth end of sound reflective material, the low frequency sounds passing around the horn were sharply refracted at the interface between the mouth of the horn and the atmosphere. This led to severe reinforcement and cancelling of sound waves, and therefore irregular magnitude and phase response. The use of a buffer 40 of considerable length and an outside surface 44 of a sound absorption coefficient inbetween the almost zero coefficient of the major portion of the horn walls and the almost 100% coefficient of the atmosphere, minimizes such irregular low frequency response.

Another phenomenon that is found to occur with high frequency horns of largely rectangular shape, is that transient distortions are encountered. Such distortions include "ringing" wherein sounds do not terminate as rapidly as the driver terminates the production of sounds at the throat of the horn. It is believed that such disturbances are caused, in part, by multiple reflections of sound at the corners of the horn, where adjacent walls such as top wall 22 and a side wall 26 or 28 meet. In accordance with another aspect of the invention, reflections from such corners are avoided by utilizing sound absorbent material at the corners. As shown in FIG. 4, the corner region 70 where the top and side walls 22, 26 meet, is covered with a band or strip 62 of highly sound absorbent material such as SCOTTFELT manufactured by Scott Paper Company, which has an absorption coefficient of about 97%. As a result, multiple reflections near the corner where the walls 22, 26 would otherwise meet, can be avoided, by merely absorbing such sounds. It may be noted that such multiple corner reflections could be avoided by utilizing rounded side walls to avoid a corner, but such curvature would result in additional focal points of the horn that could result in interference and additional perturbations.

The strips 62 can extend from the throat end 32 to the buffer 40, or at least most of the length therealong. The width of the absorbent corner strips 62 is chosen as a compromise between the desirability for wider strips to reduce ringing and the undesirability of wider strips because they absorb more sound and thereby decrease the efficiency of the horn. A width of each strip 62 along the main walls 22 and 24, is chosen so that the distance 64 occupied by the two strips at either side of a wall such as 22, occupy only about 1/5th of the total width of the wall. This results in minimal reduction of horn efficiency while providing large reduction in transient distortion. Since the width of each of the walls increases along the length of the horn, the sound absorbent strips 62 are preferably formed with a variable strip width 66 that progressively increases at locations progressively closer to the mouth of the horn, to occupy approximately the same percentage of the total width of the main walls 22, 24 along all or most of the length of the horn between its throat and mouth ends.

It will be possible to utilize sound absorbing strips 62 of a variety of cross sections. It is desirable that the surface 68 of the sound absorbing strip which forms part of the inside surface of the horn, have a curved configuration. This provides a large absorption strip surface area for absorption of sound, for a given area occupied by the strip and which therefore does not propagate sound moving along the length of the horn. It may be noted that the side walls 26, 28 are also of some importance in propagating sound, so that it is desirable that the sound absorbing strips occupy only a portion of the side walls, and with the strip-occupied proportion being substantially constant over the length of the horn. The sound absorbent strips should have a coefficient of sound absorption of at least about 80% to effectively avoid ringing effects.

In one horn constructed as shown in the drawings, the overall length 52 of the horn was about 6 inches. The main frame 36 of the horn included a mount 60 constructed to facilitate mounting on a high frequency driver, and also included a shell 72 fastened to the mount. The throat end 32 of the horn had a circular opening of about $\frac{7}{8}$ inch, while the mouth end of the horn had a width of about $6\frac{1}{2}$ inches and a height of about $2\frac{3}{4}$ inches. The buffer 40 had a length 50 of 1.1 inches while each of the strips 62 has a width 66 near the mouth end of the horn of about $\frac{3}{4}$ inch.

FIGS. 5 and 6 contain graphs 80 and 92 that show the transient behavior of horns of the prior art and of the present invention, which differ substantially only by reason of the inclusion of the buffer 40 and sound absorbing strips 62. FIG. 5 shows the output of a calibrated microphone placed in front of a horn of the prior art, when the driver 16 of the horn was driven by a tone of 2.3 kHz, and with the tone burst repeatedly turned on and off for a period of about 8 cycles at the 2.3 kHz frequency. At the point 84 along the prior art graph 80, when the driver was turned off, the amplitude of the output did not decrease to about 1/10th the amplitude present at the point 86 prior to shut-off, until about 8 cycles later. This "ringing" effect, while lasting only about $3\frac{1}{2}$ milliseconds, results in significant decrease in the quality of the sound received by a listener. The same horn, with the buffer 40 and sound absorbing strips 62 installed thereon, and driven in the same manner as the prior art horn, produced the characteristic illustrated in graph 82. It can be seen that the tone decreased to about 1/10th the level present prior to turnoff of the driver, at a point 88 which is only about 3 cycles after turn-off. It also may be noted that when the driver was initially turned on, such as at the point 90 in the prior art graph and at the point 92 in the graph representing the present horn, the prior art horn did not achieve close to full volume until after about 8 cycles, while the present horn achieved full volume after about 3 cycles. Of course, the attack and delay portions of sounds are of great importance, and their faithful reproduction is of great importance in producing sounds of high fidelity. The minimizing of ringing and other perturbations achieved by the horn of the present invention, therefore increases the fidelity of the loudspeaker system.

While a buffer 40 formed of a single band of material having a sound absorption coefficient of 50% is effective, somewhat better sound coupling could be obtained by the use of a plurality of bands of material having progressively greater sound absorption coefficients and located progressively closer to the mouth end of the horn. A portion of such a horn 14A is illustrated in FIG. 7, wherein the main housing wall 26A is similar to that of FIG. 2, but the buffer 40A has two bands 100, 102. Band 100 has a sound absorption coefficient of 30%, while band 102 has an absorption coefficient of 70% and is located closer to the mouth of the horn.

Thus, the invention provides a horn for coupling higher audible frequency sounds from a driver to the atmosphere, and which is of limited length, which provides greater fidelity in the propagation of the sounds. Better coupling of the sounds from the main horn portion which has an almost zero sound absorption coefficient, to the atmosphere which has a 100% sound absorption coefficient is enhanced by the use of a buffer having a coefficient of sound absorption inbetween that of the main horn portion and the atmosphere, such as by a buffer having a sound absorption coefficient between 20% and 80%. The band of partially sound absorbing material should have a considerable length such as about one inch. In addition, for a horizontal dispersion horn having a greater width than its height, areas of almost complete sound absorption can be provided at the corner regions where the main top and bottom walls meet the side walls. These modifications of the horn are found to avoid drastic reductions in sound output over limited frequency bands of the horn, and to also provide better transient response of the horn.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. A loudspeaker horn for coupling higher audible frequency sounds to the atmosphere, comprising:

a main housing in the form of a horn with a narrow end for receiving sound and a wide mouth end portion, most of the inner surface of said horn being substantially totally sound reflective; and a buffer lying at the mouth end portion of the horn and forming the inner surface of the horn between the extreme mouth end and a location spaced from the extreme mouth end by a distance that is less than one half the length of the horn, said buffer inside surface being partially sound absorbing and having a coefficient of sound absorption of between 20% and 80% at a frequency of 2 Kilohertz along most of the inner surface area formed by said buffer.

2. The horn described in claim 1 wherein:

said buffer includes a band of material which forms both inner and outer surface areas of the mouth end of the horn, so that one face of the band forms the inside surface of the horn near its mouth end and the other face of the band forms the outside surface of the horn near its mouth end.

3. The horn described in claim 1 wherein:

said distance along which said buffer extends is between about one-tenth and one-third the length of the horn, and said buffer has a sound absorption coefficient of about 50%.

4. The horn described in claim 1 wherein:

said buffer includes a plurality of absorbent regions of a sound absorption of between 20% and 80% spaced along the length of the horn and all lying near said mouth end, with a first absorbent region nearest the mouth end having a higher sound absorption coefficient than a second absorbent region further from the mouth end than said first region.

5. The horn described in claim 1 wherein:

said buffer lies substantially flush with the totally reflecting inside surface of said main housing.

6. The horn described in claim 1 wherein:

said buffer has a largely tear-drop shape, with an inner side substantially flush with the inside of said main housing and an outer side substantially flush with the outer side of said main housing.

7. The horn described in claim 1 wherein:

the mouth end portion of said horn is of largely rectangular cross-section, having a width greater than its height and having corner-like regions along the inside of of the horn, and includes strip-like regions of sound absorbing material extending along said corner-like regions and facing the inside of the horn.

8. The horn described in claim 1 including:

a lower frequency loudspeaker disposed about said horn; and wherein the outer surface of said horn substantially matches the gradually expanding inside surface of said horn, most of the outer surface of said horn is substantially totally sound reflective, and said buffer also forms the outside surface of said horn at the large end thereof, and the outside surface area formed by side buffer has an outside surface with a coefficient of sound absorption of between 20% and 80% at said frequency.

9. A loudspeaker horn that can be used in a coaxial speaker system, comprising:

a main housing in the form of a horn with small and large ends and with walls primarily of sound reflective material; and a buffer lying at the large end of the horn and having walls of partially sound absorbing material, said buffer having a largely tear drop cross section to provide a rounded extreme end and sides at the large end of the horn, said buffer having surfaces substantially flush with the inner and outer surfaces of said main housing.

10. A loudspeaker horn comprising:

a housing forming a horn with a narrow end portion for receiving sound and a wider mouth end portion for coupling the sound to the atmosphere, at least the mouth end portion of said horn having a largely rectangular cross section, with a cross-sectional width greater than its cross-sectional height, said housing forming walls at the inside of said horn including top and bottom main walls and also including opposite side walls spaced part by the width of the horn;

said top and bottom main walls having highly sound reflective surfaces over most of the wall areas, but the inside corners where said main walls meet said side walls having sound absorbent surface areas extending along the length of the horn.

11. The loudspeaker horn described in claim 10 including:

a buffer lying at the large end of said horn and forming the inside surface of the horn at the large end of the horn, and the portion of the inside surface of the horn formed by said buffer, having a coefficient of sound absorption of between 20% and 80% over most of its area.

12. A loudspeaker horn comprising:

a housing forming a horn with a narrow end portion for receiving sound and a wider mouth end portion for coupling the sound to the atmosphere, at least the mouth end portion of said horn having a largely rectangular cross section, with a cross-sectional width greater than its cross-sectional height, said housing forming walls at the inside of said horn including top and bottom main walls and also including opposite side walls spaced part by the width of the horn;

said top and bottom main walls having highly sound reflective sufaces over most of the wall areas, but the corners where said main walls meet said side walls having sound absorbent surface areas, with said sound absorbent surface areas being of progressively greater width at locations progressively closer to the mouth end of the horn.

13. A loudspeaker horn comprising:

a housing forming a horn with a narrow end portion for receiving sound and a wider mouth end portion for coupling the sound to the atmosphere, at least the mouth end portion of said horn having a largely rectangular cross section, with a cross-sectional width greater than its cross-sectional height, said housing forming walls at the inside of said horn including top and bottom main walls and also including opposite side walls spaced part by the width of the horn;

said housing including walls of hard sound reflective material forming most of the inside surface of said horn, and forming corners where said walls meet, and said housing also includes strip-like areas of sound absorbent material fastened to said walls and lying in said corners.

14. The loudspeaker horn described in claim 13 wherein:

said strip-like areas are rounded on the surface facing the inside of said horn, whereby to provide an increased sound-absorbing surface area.

* * * * *